United States Patent [19]

Kaufman

[11] Patent Number: 4,713,723

[45] Date of Patent: Dec. 15, 1987

[54] ISOLATION TRANSFORMER

[76] Inventor: Lance R. Kaufman, 131 N. White Oak Way, Mequon, Wis. 53092

[21] Appl. No.: 880,707

[22] Filed: Jul. 1, 1986

[51] Int. Cl.[4] .............................................. H03K 3/00
[52] U.S. Cl. .................................... 361/179; 307/116; 336/73
[58] Field of Search ................... 361/179–181, 361/38; 307/106, 116, 108; 336/73, 75, 79, 115, 117, 119, 120

[56] References Cited

U.S. PATENT DOCUMENTS

| | | | |
|---|---|---|---|
| 3,900,770 | 8/1975 | Kaufman | 317/148.5 B |
| 3,953,816 | 4/1976 | Hennequin | 336/119 |
| 3,958,075 | 5/1976 | Kaufman | 174/16 HS |
| 4,021,728 | 5/1977 | Makino et al. | 361/180 |
| 4,156,148 | 5/1979 | Kaufman | 250/551 |
| 4,196,411 | 4/1980 | Kaufman | 338/314 |
| 4,215,235 | 7/1980 | Kaufman | 174/52 PE |
| 4,218,724 | 8/1980 | Kaufman | 361/395 |
| 4,250,481 | 2/1981 | Kaufman | 338/163 |
| 4,257,091 | 5/1981 | Kaufman | 363/85 |
| 4,266,140 | 5/1981 | Kaufman | 250/551 |
| 4,394,530 | 7/1983 | Kaufman | 174/16 HS |
| 4,425,511 | 1/1984 | Brosh | 307/106 |
| 4,449,165 | 5/1984 | Kaufman | 361/386 |
| 4,449,292 | 5/1984 | Kaufman | 29/631 |
| 4,488,202 | 12/1984 | Kaufman | 361/386 |
| 4,498,120 | 2/1985 | Kaufman | 361/386 |
| 4,546,410 | 10/1985 | Kaufman | 361/387 |
| 4,546,411 | 10/1985 | Kaufman | 361/387 |
| 4,554,613 | 11/1985 | Kaufman | 361/386 |
| 4,574,162 | 3/1986 | Kaufman | 174/16 HS |
| 4,577,387 | 3/1986 | Kaufman | 29/458 |

FOREIGN PATENT DOCUMENTS 2840514  3/1979  Fed. Rep. of Germany .
8877379  7/1979  Japan .

Primary Examiner—A. D. Pellinen
Assistant Examiner—Todd E. DeBoer
Attorney, Agent, or Firm—Andrus, Sceales, Starke & Sawall

[57] ABSTRACT

An isolation transformer is provided by a primary conductor formed on an insulating layer above a secondary conductor formed on a chip therebelow, with flux lines coupling between the primary and secondary conductors to provide transformer action through the insulating layer therebetween. The primary is formed by a serpentine pattern having a plurality of parallel strips transverse to a plurality of parallel strips forming the secondary conductor. The secondary conductor may be formed on an extra insulating layer on the chip substrate.

5 Claims, 3 Drawing Figures

ISOLATION TRANSFORMER

BACKGROUND AND SUMMARY

The invention relates to isolation transformers for electrically isolating an input signal from an output signal. The invention provides a particularly simple and effective low cost isolation transformer.

DETAILED DESCRIPTION

Figure 1:
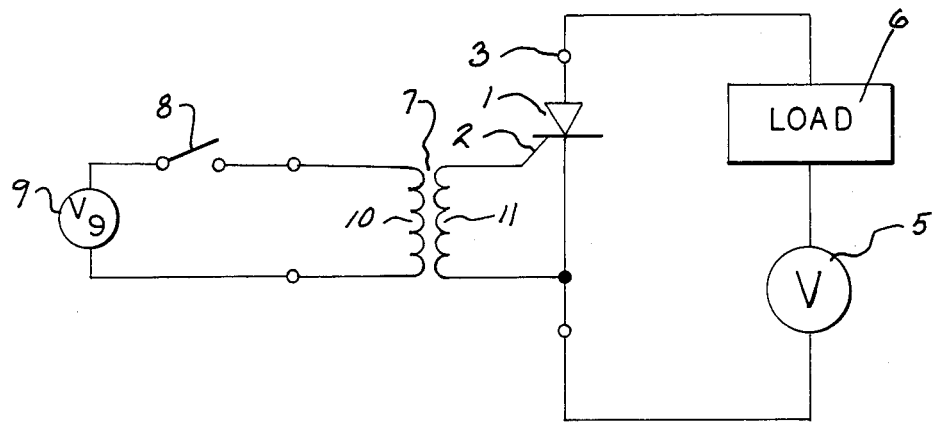
FIG. 1 shows transformer circuitry known in the prior art.

FIG. 1 shows known prior art wherein a semiconductor switch such as an SCR 1, or a transistor, etc., has a gate terminal 2 for triggering the SCR into conduction to complete a current path between anode 3 and cathode 4 when gate 2 is biased positively relative to cathode 4. Conduction between main terminals 3 and 4 completes a circuit through voltage source 5 and load 6. For isolation purposes, a transformer 7 may be used to supply the gating signal. Upon closure of switch 8, gating voltage source 9 causes current to flow through primary conductor 10 which induces current in secondary conductor 11 to in turn provide the gating signal.

Figure 2:
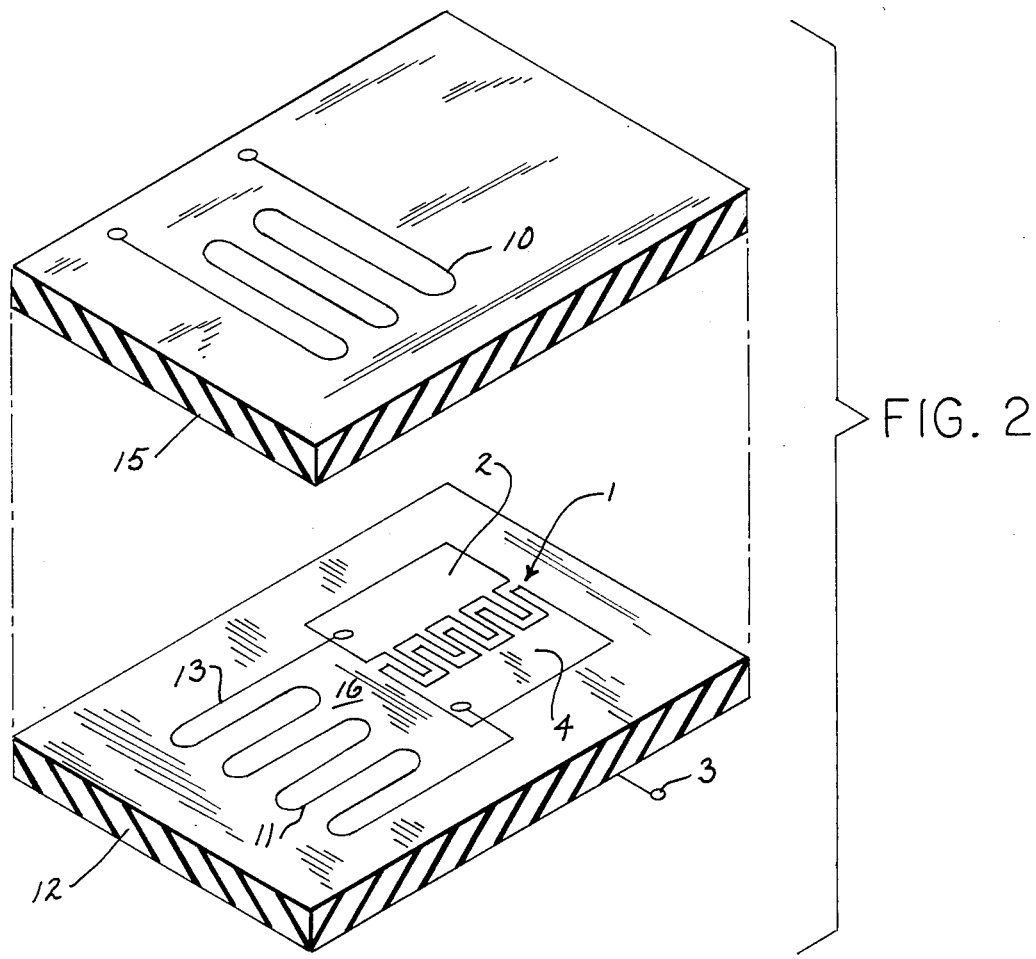
FIG. 2 shows an isolation transformer in accordance with the invention.

FIG. 2 shows an isolation transformer in accordance with the invention, and like reference numerals are used from FIG. 1 where appropriate to facilitate clarity. The isolation transformer is integrated on the same chip 12 with the semiconductor switch such as SCR 1, or a transistor, etc. As is known in the art, SCR 1 is integrated on semiconductor substrate 12 and may have a bottom anode contact 3, and a cathode 4 and gate 2 formed on the upper surface by a plurality of interdigitated fingers. As in FIG. 1, when a gating signal is applied to gate terminal 2, switch 1 is gated into conduction to conduct current between main terminals 3 and 4, to complete a circuit and conduct current through load 6 from voltage source 5.

Secondary conductor 11 is formed by deposition of a conductive pattern on substrate 12 and connected at one end 13 to gate terminal 2 and connected at the other end 14 to cathode terminal 4. An electrically insulating layer 15, for example silicon dioxide if substrate chip 12 is silicon, is formed on substrate 12, for example by thermal growth of an oxide, over secondary conductor 11 and SCR 1. Additional layers may be formed as part of layer 15. Primary conductor 10 is formed by deposition of a conductive pattern on insulating layer 15 proximate secondary conductor 11 and spaced above secondary conductor 11 by insulating layer 15. Current flow through primary conductor 10, from gating voltage source 9, induces current in secondary conductor 11 to provide the gating signal for SCR 1. Flux lines couple between the primary and secondary conductors 10 and 11 to provide transformer action through insulating layer 15 therebetween.

In preferred form, each of primary and secondary conductors 10 and 11 is formed by a serpentine pattern having a plurality of parallel strips joined at their ends by U-shaped portions. For preferred coupling, the plurality of parallel strips of primary conductor 10 are transverse to the plurality of parallel strips of secondary conductor 11.

Figure 3:
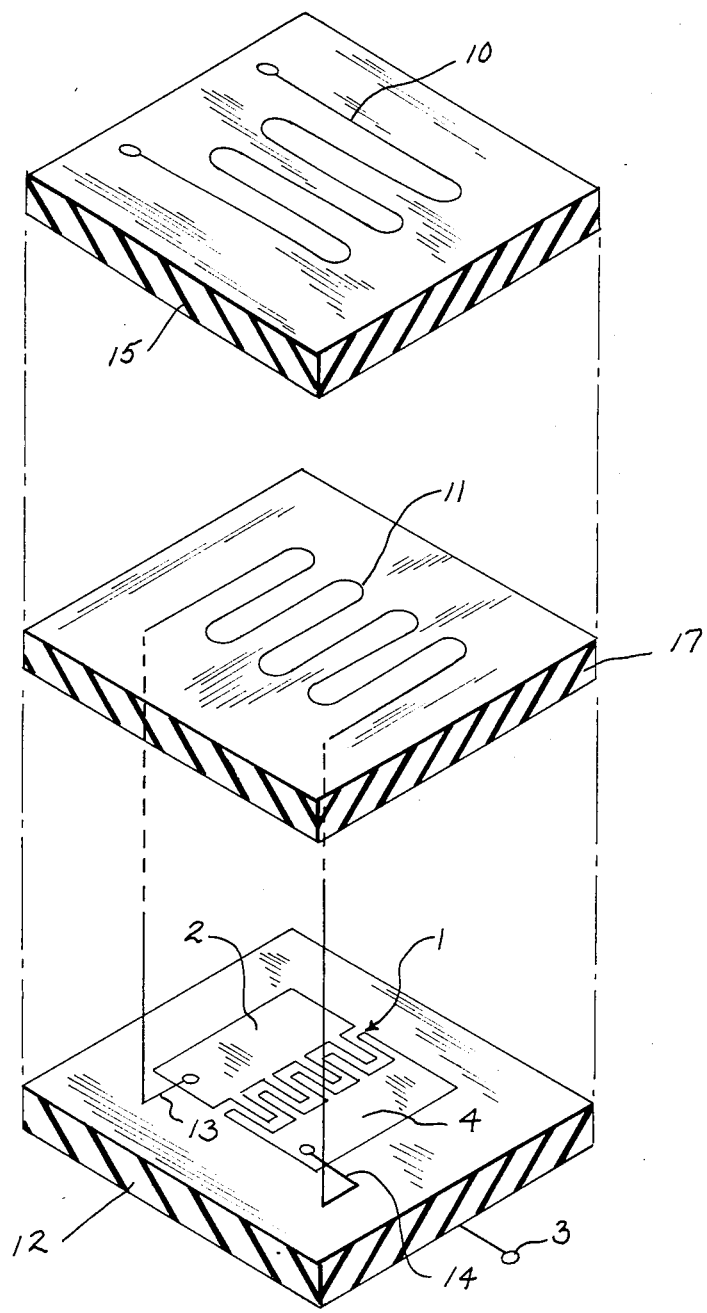
FIG. 3 shows an alternate embodiment of FIG. 2.

FIG. 3 shows an alternate embodiment, and like reference numerals are used from FIG. 2 where appropriate to facilitate clarity. In FIG. 2, secondary conductor 11 is horizontally adjacent switch 1 and separated therefrom by a portion 16 of substrate 12 providing electrically insulating means therebetween. In FIG. 3, secondary conductor 11 is vertically spaced from switch 1 and separated by electrically insulating means 17 therebetween. Layer 17 is part of substrate 12 and formed in the final processing step to cover and protect switch 1, or is a separate silicon dioxide layer added over the substrate for the specific purpose of receiving secondary conductor 11 deposited thereon, followed by layer 15 and primary conductor 10. In the preferred form of this embodiment, semiconductor switch 1 and primary and secondary conductors 10 and 11 are vertically aligned. The ends 13 and 14 of secondary conductor 11 are connected through layer 17 to the respective gate terminal 2 and main terminal 4. Current flow through primary conductor 10 induces current in secondary conductor 11 to provide the gating signal, wherein flux lines couple between the primary and secondary conductors to provide transformer action through insulating layer 15.

It is recognized that various equivalents, alternatives and modifications are possible within the scope of the appended claims.

I claim:

1. In combination with a semiconductor switch integrated on a semiconductor substrate and having a pair of main terminals and having a gate terminal gating said switch into conduction to conduct current between said main terminals when a gating signal is applied to said gate terminal, an isolation transformer comprising:

first electrically insulating layer means formed on the top of said substrate;

a transformer secondary conductor formed on the top of said first electrically insulating layer means and connected at one end to said gate terminal and at the other end to one of said main terminals;

second electrically insulating layer means formed on said first electrically insulating layer means over said secondary conductor;

a transformer primary conductor formed on said second insulating layer means proximate said secondary conductor, such that current flow through said primary conductor induces current in said secondary conductor to provide said gating signal, wherein flux lines couple between said primary and secondary conductors to provide transformer action through said second insulating layer means therebetween.

2. The invention according to claim 1 wherein said semiconductor switch and said primary and secondary conductors are substantially vertically aligned.

3. The invention according to claim 1 wherein said one end of said secondary conductor extends downwardly through said first electrically insulating layer means to said gate terminal, and wherein said other end of said secondary conductor extends downwardly through said first electrically insulating layer means to said one of said main terminals.

4. The invention according to claim 1 wherein each of said primary and secondary conductors is formed by a serpentine pattern having a plurality of parallel strips joined at their ends by U-shaped portions.

5. The invention according to claim 4 wherein said plurality of parallel strips of said primary conductor are transverse to said plurality of parallel strips of said secondary conductor.

* * * * *